(12) United States Patent
Liao

(10) Patent No.: US 6,175,135 B1
(45) Date of Patent: Jan. 16, 2001

(54) TRENCH CONTACT STRUCTURE OF SILICON ON INSULATOR

(75) Inventor: Kuan-Yang Liao, Taipei (TW)

(73) Assignee: United Silicon Incorporated, Hsinchu (TW)

(*) Notice: Under 35 U.S.C. 154(b), the term of this patent shall be extended for 0 days.

(21) Appl. No.: 09/082,658

(22) Filed: May 21, 1998

(30) Foreign Application Priority Data

Mar. 20, 1998 (TW) .................................. 87104160

(51) Int. Cl.[7] ........................... H01L 27/01; H01L 27/12; H01L 31/0392
(52) U.S. Cl. .......................... 257/350; 257/347; 257/370
(58) Field of Search .................................... 257/347, 350, 257/370, 378, 382, 349

(56) References Cited

U.S. PATENT DOCUMENTS

| | | | |
|---|---|---|---|
| 5,559,368 | * 9/1996 | Hu et al. | 257/369 |
| 5,717,227 | * 2/1998 | Kim | 257/139 |
| 5,780,899 | * 7/1998 | Hu et al. | 257/335 |
| 5,789,790 | * 8/1998 | Morishita et al. | 257/378 |
| 5,808,346 | * 9/1998 | Ueda | 257/774 |

* cited by examiner

Primary Examiner—Olik Chaudhuri
Assistant Examiner—Phat X. Cao
(74) Attorney, Agent, or Firm—Jiawei Huang; J C Patents

(57) ABSTRACT

The structure in this present invention includes a substrate having a buried-in oxide layer near the surface of the substrate and a silicon surface layer of base over the buried-in oxide layer. After that the structure further includes a conductive layer of gate on the substrate, a dielectric layer on the conductive layer of gate, a metal plug penetrates through the conductive layer and the dielectric layer and reach down to the silicon surface layer but not through. The metal plug, the conductive layer of gate and the silicon surface of base are electrically coupled together.

4 Claims, 2 Drawing Sheets

TRENCH CONTACT STRUCTURE OF SILICON ON INSULATOR

CROSS-REFERENCE TO RELATED APPLICATION

This application claims the priority benefit of Taiwan application serial no. 87104160, filed Mar. 20, 1998, the full disclosure of which is incorporated herein by reference.

BACKGROUND OF THE INVENTION

1. Field of the Invention

This invention relates to a structure of a trench contact structure of silicon on insulator (SOI), and more particular to a structure of a trench contact structure of SOI used in a Bipolar-Complementary-Metal-Oxide-Semiconductor (BiCMOS) device.

2. Description of Related Art

The technology of SOI is about a technology of isolation used in a complementary-metal-oxide-semiconductor (CMOS) device. Its characteristics is that an insulating layer, in general, made of silicon dioxide is formed closely under the surface of the substrate to isolate the CMOS device from the main silicon substrate. Therefore, because the CMOS area isn't connected to the substrate, latch-up happening on the transistors within the active area would disappear due to the routes causing latch-up such as source to subtrate or well to substrate having been disconnected by the insulating layer.

The SOI described in the above can be done by one of following methods like separation by implanted oxygen (SIMOX), bonded wafer (BW), or dielectric isolation (DI). The advantages of the technology of SOI in the fabrication of the integrated circuit is not only able to effectively restrain the happening of latch-up electrically on the CMOS transistors due to the parasitic bipolar effect but also able to increase the immunity of MOS device to the soft error induced by the at particles. In the fabricating procedures, due to the line width being allowed to be reduced, it would be easier for the fabrication and therefore the size of the parasitic capacitors and the device are reduced to be able to increase the speed of the operation of the circuit.

The idea of a BiCMOS device is to carry both bipolar transistors and CMOS transistors so that the parts of circuit needing the high speed of the operation and the high current such as the Input/Output (I/O) can be done by the bipolar transistors and the areas needing the high integration and the low consumption of power such as the array area can be made by the CMOS transistors.

A BiCMOS device is formed on a substrate, which carries the structure with SOI, and lets the gate of the CMOS transistor be electrically coupled to the base of the transistor, in that a low power-delay multiplier would be more efficient. To apply a low voltage on the gate of the CMOS transistor some area of the available area of the device is needed to make a contact window and to apply a low voltage on the substrate with SOI device an additional area is needed either. This would undermine the integration due to the consuming of the area.

FIG. 1 illustrates the top view of a scheme of a conventional BiCMOS device using the technology of SOI. Referring to FIG. 1 a substrate 100 has a structure of SOI, wherein a gate 102 of the MOS and the source/drain regions 104a, 104b are formed on the substrate 100. The gate 102 and the base 101 are interconnected to the metal layer 108 through the contact windows 106b and thus they are electrically coupled together. Moreover a doped area 110 on the substrate around the contact window 106b with the same type of dopant as used in the substrate but higher density is to give a better electrically coupled effect. The scheme as illustrated in the FIG. 1 has a few drawbacks that it increases the needed area of the device and results in the decrease of the integration and the complexity in the fabricating procedures.

SUMMARY OF THE INVENTION

It is therefore an objective of the present invention to provide a trench contact structure filled by a metal layer to allow the substrate and the conductive layer of gate to be electrically coupled together so that the fabricating procedures would be significantly simplified and the integration would be increased either due to the smaller use of the needed area in the device.

In accordance with the foregoing and other objectives of the invention, a trench contact structure of SOI having a substrate carrying a buried-in oxide layer and a silicon layer covering on the buried-in layer includes a conductive layer of -ate forming on the substrate, a dielectric layer forming on device by a chemical vapor deposition (CVD) method and a metal plug penetrating the dielectric layer and the conductive layer of gate to reach the silicon layer of base but not through it. Thus, the metal plug, the conductive layer of gate and the silicon layer are coupled together. There is a doped area around the contact area between the surface of the silicon layer of base and the metal plug. This doped area has the same type of dopant as used in the silicon layer of base but has higher density.

In short conclusions, the invention by utilizing a metal plug to fill into the trench contact structure on a substrate with SOI structure allows the substrate layer, the conductive layer and the metal plug to be electrically coupled together to reduce the size of the device and complexity of the fabricating procedures.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
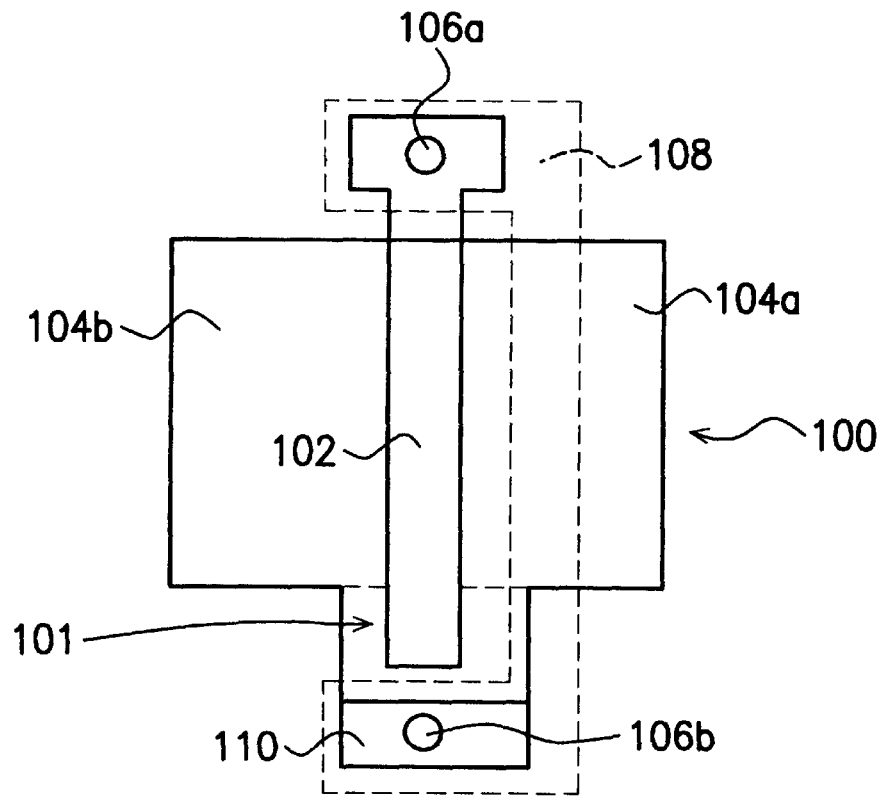
FIG. 1 illustrates the top view of a scheme of a conventional BiCMOS device using the technology of SOI.
Figure 2:
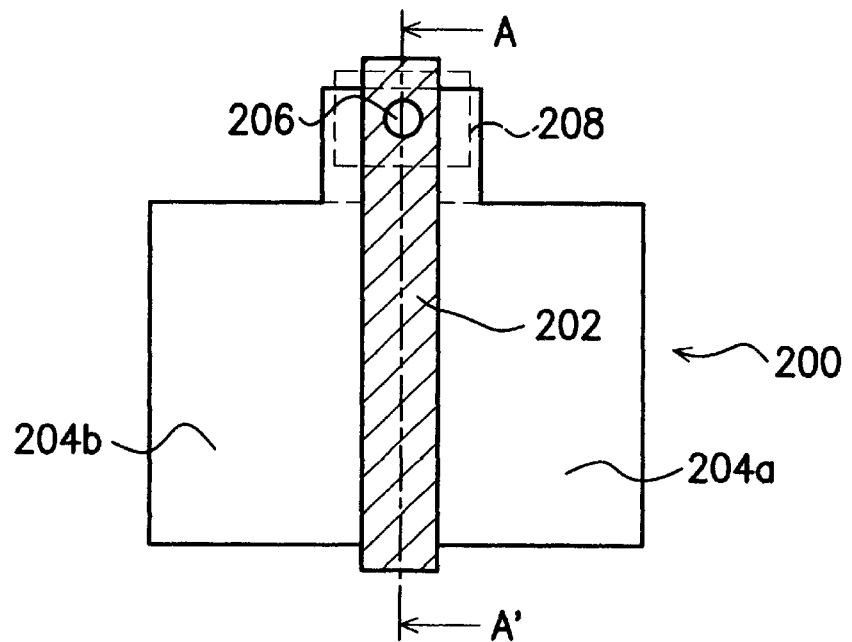
FIG. 2 illustrates the top view of a scheme of a conventional BiCMOS device using the technology of SOI according to the preferred embodiments of the invention.

FIG. 2 illustrates the top view of a scheme of a conventional BiCMOS device using the technology of SOI according to the preferred embodiments of the invention.

A layout which lets the substrate with SOI, the gate of a transistor and the metal layer be electrically coupled tog, ether and saves the needed size of the semiconductor device is illustrated in the FIG. 2. Referring to FIG. 2, on the substrate with SOI 200, a conductive layer 202 such as a gate 202 of a MOS transistor is formed. The conductive layer 202, for example, can be a metal layer or a doped polysilicon layer. Then, the interchangable source/drain regions, 204a, 204b are formed on the both sides of the gate 202, respectively. Both the substrate of the SOI 200 and the conductive layer 202 can be electrically coupled together through the contact window 206. The lower end of the contact window 206 is the contact place on the substrate of the SOI 200, in which a doped area 208 is formed on the substrate of the SOI 200 as also shown in the FIG. 3 marked with reference number 309. This doped area has the same type of dopant as used in the silicon layer but has higher density to enhance the better connecting quality as is going to be described in the FIG. 3.

Figure 3:
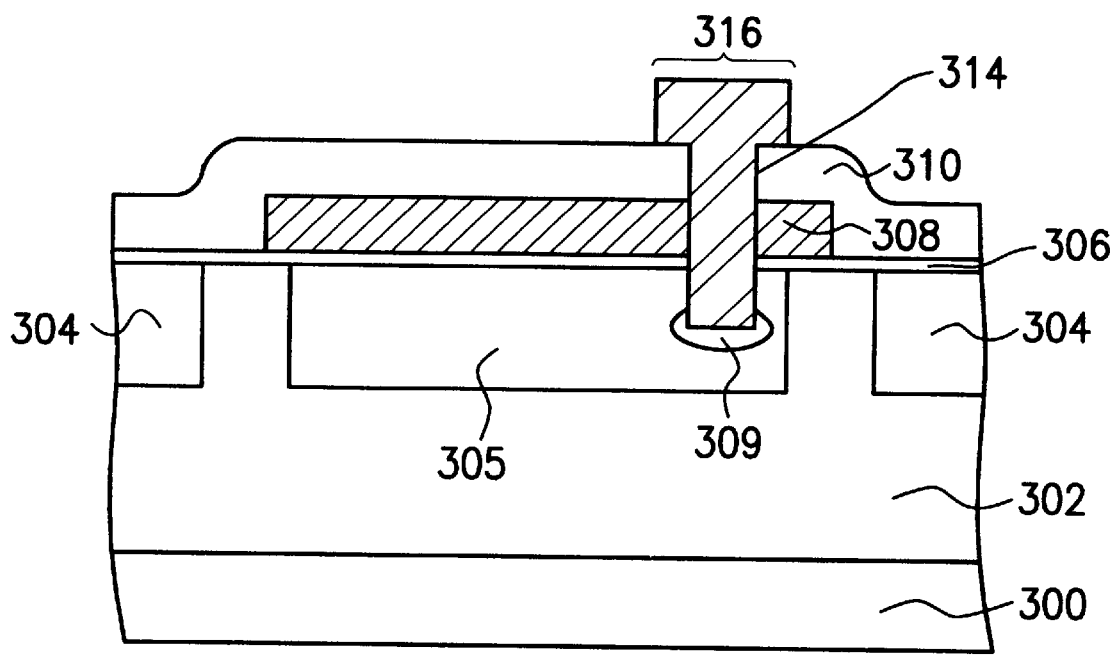
FIG. 3 illustrates the sectional view along the cutting line of A—A' as marked in the FIG. 2.

FIG. 3 illustrates the sectional view along the cutting line of A—A' as marked in the FIG. 2. Referring to the FIG. 3, the substrate of the SOI 300 has a buried-in oxide layer 302 on it. A silicon surface layer 304 and a silicon surface layer of base 305 is formed on the top part of the substrate of the SOI 300. A gate oxide layer 306 is formed on the substrate of the SOI 300. Then a conductive layer of gate 308 and a dielectric layer 310 are formed sequentially over the substrate 300 and are defined to form a contact window 314, which is through the dielectric layer 310, the conductive layer of gate 308 and the gate oxide layer 306 and reaches down to the silicon surface layer of base 305 but not through. A conventional implant procedure is applied to dope a doped area 309 with the same dopant as used on the silicon surface layer of base 305 but with higher density. A contact window 314 is formed on an area 316 by a method of photolithography etching. After the doping being finished on the contact window 314, a metal plug 312 has been filled into the contact window 314. The reason to have higher density on the doped area is to enhance the better electrically coupled quality between the silicon surface layer 304 on the substrate of the SOI 300 and the metal plug 312 and then the conductive layer of gate 308. Therefore, all of the substrate of the SOI 300, the conductive layer 308 and the metal plug 312 are electrically coupled together.

As shown in FIGS. 2 and 3, the silicon surface layer 304 and the conductive layer 308 are electrically coupled together through the metal plug 312 so that low voltage can be applied by just using a needed area occupied by the metal plug 312. This give the reduction of the device size. Moreover since only one procedure of photolithography etching is needed to define the contact window the fabricating is essentially simplified.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A trench contact structure, comprising:

a silicon on insulator structure;

a buried-in oxide layer, on the silicon on insulator structure;

a silicon surface layer, on the buried-in oxide layer without direct contact with the silicon on insulator structure;

a gate oxide layer, on the silicon surface layer;

a gate, on the gate oxide layer;

a dielectric layer, on the gate;

a doped region, in the silicon surface layer without contact with the buried-in oxide layer and having a dopant the same as that of the silicon surface layer but has a higher density; and a metal plug, penetrating through the gate, the dielectric layer, the gate oxide layer and an upper portion of the silicon surface layer to couple with the doped region.

2. The structure of the contact window of claim 1, wherein the conductive layer includes a polysilicon layer.

3. The structure of the contact window of claim 1, wherein the polysilicon layer is doped.

4. The structure of the contact window of claim 1, wherein the conductive layer includes a metal layer.

\* \* \* \* \*